(12) United States Patent
Werner

(10) Patent No.: US 6,337,499 B1
(45) Date of Patent: Jan. 8, 2002

(54) SEMICONDUCTOR COMPONENT

(75) Inventor: Wolfgang Werner, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/530,668

(22) PCT Filed: Aug. 17, 1998

(86) PCT No.: PCT/DE98/02373

§ 371 Date: Aug. 4, 2000

§ 102(e) Date: Aug. 4, 2000

(87) PCT Pub. No.: WO99/23704

PCT Pub. Date: May 14, 1999

(51) Int. Cl.⁷ ............. H01L 29/78; H01L 29/417; H01L 29/06

(52) U.S. Cl. ............ 257/329; 257/330; 257/331; 257/339; 438/212

(58) Field of Search .................. 257/213, 288, 257/328, 499, 329, 330, 331, 339, 341, 342; 438/212

(56) References Cited

U.S. PATENT DOCUMENTS 5,216,275 A * 6/1993 Chen .................. 257/493
5,576,567 A * 11/1996 Mori .................. 257/316

FOREIGN PATENT DOCUMENTS

| DE | 43 09 764 | 1/1997 |
| DE | 196 00 400 | 7/1997 |
| EP | 0 477 873 | 4/1992 |
| GB | 2 089 118 | 6/1982 |
| WO | WO 97/29518 | 8/1997 |
| WO | WO 97/40527 | 10/1997 |

OTHER PUBLICATIONS

Patent Abstracts of Japan: vol. 16, No. 8, (E–1152), Jan. 10, 1992 & JP 03 229443 dated Oct. 11, 1991.

Patent Abstracts of Japan: vol. 12, No. 38 (E–580), Feb. 4, 1988 & JP 62 193261 dated Aug. 25, 1987.

J.S. AJIT, "1200 High–Side Lateral MOSFET in Junction–Isolated Power IC Technology Using Two Field–Reduction Layers", International Rectifier, 233 Kansas Street, El Segundo, CA 90245, pp. 230–235.

* cited by examiner

Primary Examiner—Olik Chaudhuri
Assistant Examiner—Dilinh Nguyen
(74) Attorney, Agent, or Firm—Schiff Hardin & Waite

(57) ABSTRACT

The invention is directed to a semiconductor component having a semiconductor body with two principal faces, at least two electrodes at least one electrode being provided on a principal face, and zones of a conductivity type opposite one another that are arranged in alternation in the semiconductor body and extend perpendicularly to the two principal faces. For an application of a voltage to the two electrodes, the zones arranged in alternation mutually clear of charge carriers so that an essentially constant field strength is built up in the semiconductor body between the two electrodes These zones arranged in alternation inventively contain at least one cavity that is preferably closed by a glass layer.

6 Claims, 3 Drawing Sheets

SEMICONDUCTOR COMPONENT

BACKGROUND OF THE INVENTION

1. Field of the Invention

The invention is directed to a semiconductor component with a semiconductor body having two principal faces, at least two electrodes, at least one electrode being provided on a principal face. The component has zones of mutually opposite conductivity type that are arranged in alternation in the semiconductor body and extend perpendicularly to the two principal faces. When voltage is applied to the two electrodes, the zones arranged in alternation are mutually cleared of charge carriers, so that an essentially constant field strength is built up in the semiconductor body between the two electrodes.

2. Description of the Related Art

German patent DE 43 09 764 discloses a similar semiconductor component. This publication, discloses a power MOSFET with a semiconductor body having an inner zone of the first conductivity type, having a base zone of the second conductivity type that adjoins the inner zone and a first principal face of the semiconductor body and into which a source zone is embedded, and having a drain zone adjoining one of the principal faces of the semiconductor body. Additional zones of the second conductivity type and further additional zones of the first conductivity type that lie between the additional zones of the second conductivity type and that are more highly doped than the inner zone are provided in the inner zone.

As a result of the "junction-trench" principle realized in this power MOSFET, the name of this principle being based on the generation of the additional zones by trenches, the specific turn-on resistance of highly inhibiting DMOS transistors can be substantially improved: the drift zone that is otherwise uniformly doped in DMOS transistors, is replaced by the alternately arranged zones of mutually opposite conductivity type, i.e., by n-doped zones and p-doped zones arranged in alternation. These n-doped zones and p-doped zones already mutually clear their charge carriers for small voltages applied to the respective electrodes, so that, similar to a PIN diode, a nearly constant field strength between the two electrodes, i.e., the drain electrode or, respectively, the highly doped n+ drain terminal and the source electrode or, respectively, the p-conductive semiconductor body can build up in such a DMOS transistor when an inhibit voltage is applied. The n-doped zones can thereby be more highly doped by about one order of magnitude, which leads to a corresponding reduction of the turn-on resistance.

The above-described principle of clearing the drift region of charge carriers is also applied in lateral resurf (reduced surface field transistors), as described in an article "1200 V High-Side Lateral MOSFET in Junction-Isolated Power IC Technology Using Two Field-Reduction Layers", by J. S. Ajit, Dan Kinzer and Niraj Ranjan in "International Rectifier", 233 Kansas Street, El Segundo, Calif. 90245, pages 230–235. Such lateral resurf transistors can be more simply manufactured than vertical structures with zones of different conductivity type in alternation. The lateral format, however, causes a substantially greater area requirement that is greater by a factor of approximately 10 than that given vertical structures.

Various paths are currently taken for manufacturing zones of alternatingly changing conductivity type extending vertically to the principal faces of a semiconductor body, i.e., n-doped zones and p-doped zones: in a first method, build-up technique is employed in which the n-doped zones and the p-doped zones are "built up" step-by-step with the assistance of corresponding masks. A second method that is currently under much discussion comprises etching deep trenches or, respectively, holes in, for example, an n-doped semiconductor body and epitaxially filling the holes that have thus arisen with oppositely doped semiconductor material, preferably silicon. For voltages on the order of magnitude of 600 V, the trenches or, respectively, holes must be introduced approximately 40 $\mu$m deep and should comprise a depth that does not significantly fall below 2 $\mu$m.

This second method allows significantly smaller grids and, thus, smaller turn-on resistances to be realized than with the build-up technique. The filling of the trenches or, respectively, holes, however, presents a great unanswered problem whether or not it will ever be possible to fill the trenches bubble-free. In order to achieve the desired dielectric strength for voltage on the order of magnitude of 600 V, the trenches or, respectively, holes should have a depth of 40 $\mu$m. The manufacture of a vertical resurf transistor with the methods being currently developed poses problem when a dielectric strength up to approximately 600 V or more is to be achieved.

German patent DE 19 600 400 A1 discloses a micromechanical component with a planarized cover on a cavity. This cover comprises a membrane layer and a cover layer that is preferably composed of doped glass. The cover layer is subjected to a flow step, in which this layer does not flow into the cavity but rather forms a planar cover at an upper or lower edge.

SUMMARY OF THE INVENTION

An object of the present invention is to provide a semiconductor component of the species initially cited such that the component can be produced without the problems such as bubbles in trenches, discussed above. An additional object a method for manufacturing such a semiconductor component as well as the advantageous employment of it.

This object is achieved by semiconductor component is provided comprising a semiconductor body with two principal faces, at least two electrodes wherein at least one of the electrodes is provided on one of the principal faces, and zones of a conductivity type opposite one another that are arranged in alternation in the semiconductor body and extend perpendicularly to the two principal faces, an application of a voltage to the two electrodes mutually clearing the zones of charge carriers so that an essentially constant field strength is built up in the semiconductor body between the two electrodes the containing at least one cavity that is closed by a glass layer or by a sputtered layer.

This object is also achieved by a method for manufacturing a semiconductor component, comprising the sequential steps of introducing trenches into a semiconductor body; applying a thin epitaxial layer or a doped oxide layer on the inside walls of the trenches, producing a remaining cavity, and closing the remaining cavity of the trenches with a doped glass layer or a sputtered layer.

Advantageous developments of the invention are recited below.

What is critical about the inventive semiconductor component is that it contains at least one cavity that can have a trench structure with a width of, for example, 1 $\mu$m and a depth of, for example, 40 $\mu$m. This cavity is closed at its end lying opposite the one principal face, to which end a glass layer can be utilized. This glass layer can, for example, be composed of doped borophosphorous silicate (BPSG). Another possibility for closing the cavity is comprised in sputtering a cover layer.

The inside walls of the cavity can be provided with a passivation layer of, for example, silicon dioxide.

What is critical about the inventive semiconductor component is that the complete filling of holes or, respectively, trenches is foregone. On the contrary, the trenches remain after the manufacture of the oppositely doped zones arranged in alternation. This zones can be generated, for example, by etching trenches and subsequent epitaxial deposition or be deposition of a doped oxide onto the inside surface of the trenches and subsequent drive-out from the doped oxide.

The standard etching technique can be utilized for the production of the trenches themselves or, on the other hand, an electrochemical method can be utilized. It is significant, however, that the trenches still have an opening of approximately 1 µm over their entire depth of, for example, 40 µm after the production of the zones that are doped opposite one another.

The inside wall of the trenches is passivated by a thin oxide layer before closing these trenches, a gate oxide layer that, for example, is 50 nm thick may be utilized for this purpose.

The closing of the trenches or, respectively, holes can, for example, be undertaken by deposition of a doped glass such as, for example, borophosphorous silicate glass and subsequent flowing in a vacuum. However, a closure layer can also be applied onto the openings of the trenches or, respectively, holes by sputtering.

After application of the doped glass, this closure layer is wet-chemically etched back in a standard way in diluted hydrofluoric acid (HF), so that a planar surface structure arises.

When a vertical resurf transistor is manufactured, then the transistor structure can be subsequently built up between the trenches with a standard DMOS cell. However, it is also possible, for example, to produce a DMOS transistor first and to subsequently etch the trenches or, respectively, holes and to then—explained above, dope and close these.

BRIEF DESCRIPTION OF THE DRAWINGS

The invention is explained in greater detail below on the basis of the drawings.

DESCRIPTION OF THE PREFERRED EMBODIMENTS

Figure 1:
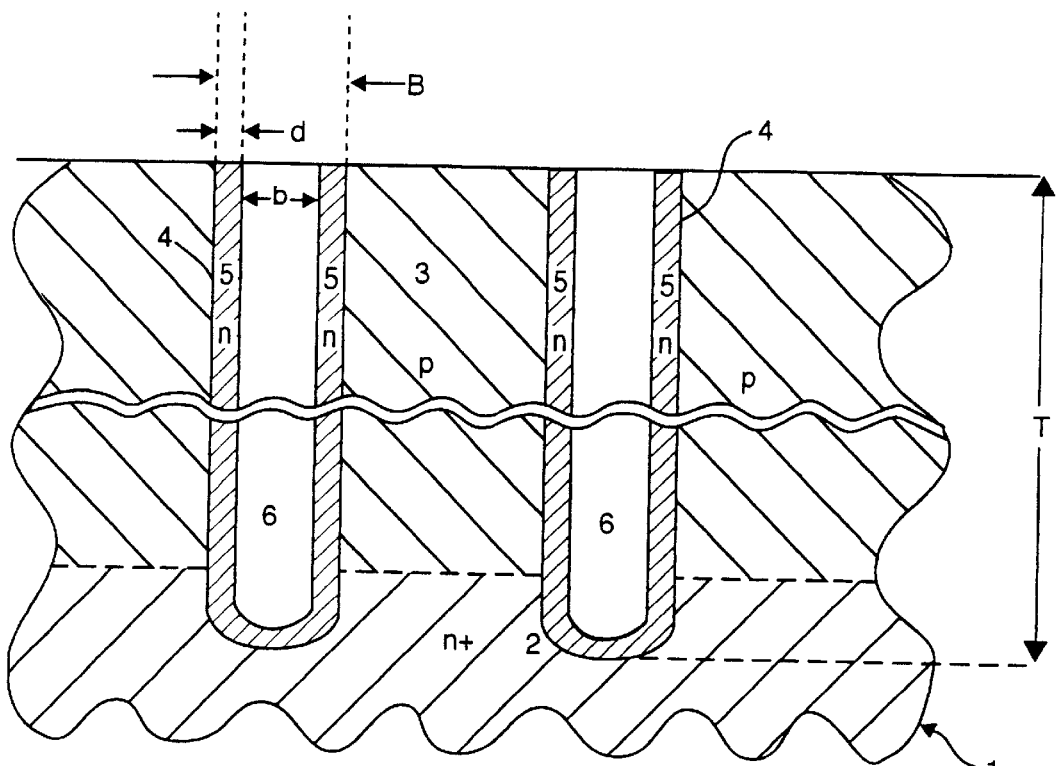
FIG. 1 is a cross-section through a semiconductor arrangement for explaining a first method for generating trenches and layers that are oppositely doped in alternation.

FIG. 1 shows a semiconductor body 1 composed of an $n^+$-conductive region 2 and a p-conductive region 3. The p-conductive region 3 can, for example, be formed by epitaxial deposition on the $n^+$-conductive region 2, which serves as a substrate.

Trenches 4 having a depth T of approximately 40 µm and a width B of approximately 3 µm are introduced into the p-conductive region 3 by etching. An electrochemical method can also be utilized instead of etching. The etching depth can also be less than the thickness of the region 3.

An n-conductive epitaxial layer 5 is then deposited in the trenches 4, which has a layer thickness d of approximately 1 µm. After application of this epitaxial layer 5, a cavity 6 that still has a width b of approximately 1 µm thus remains in the trench 4.

The respective epitaxial layers 5 and the p-conductive region 3 thus form zones of mutually opposite conductivity type that are arranged in alternation and extend perpendicular to the two principal faces of the semiconductor body 1.

Figure 2:
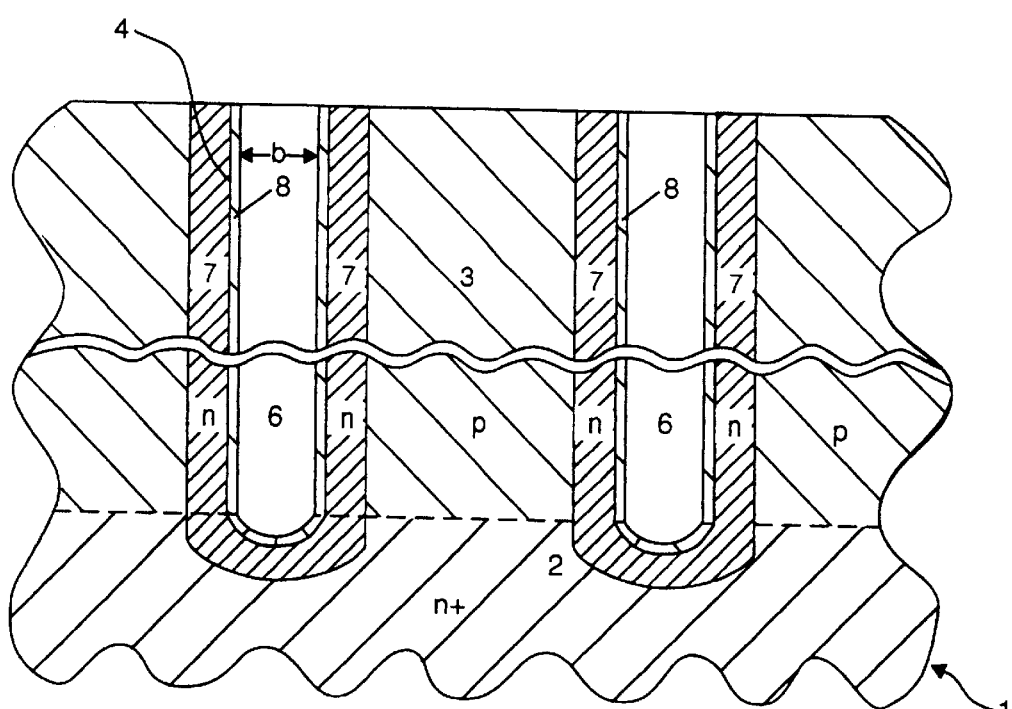
FIG. 2 is a cross-section through a semiconductor arrangement for explaining a second method for generating trenches and layers that are oppositely doped in alternation.

FIG. 2 illustrates another method for manufacturing this zones of mutually opposite conductivity type: in this method, too, trenches 4 having a width of approximately 2.2 through 3 µm are introduced into the p-conductive region 3 down to the $n^+$-conductive region 2. Instead of the epitaxial layer 5, however, a doped oxide layer 8, for example, a doped silicon dioxide layer, is deposited onto the inside surface of the trenches 4, this layer 8 being subsequently heated, so that dopant, (e.g., phosphorous), from the doped oxide layer 8 penetrates into the neighboring areas of the p-conductive region 3 in order to form an n-conductive zone 7 thereat. This doped oxide layer 8 exhibits a layer thickness of about 0.1 through 0.5 µm, so that a remaining width b of approximately 1 µm also remains for the cavity 6.

Regardless of whether the method according to FIG. 1 ("trench etching and epi-deposition") or the method according to FIG. 2 ("trench etching, deposition of doped oxide and drive-out") is implemented, it is critical that the cavity 6 remains with a width b of approximately 1 µm over a depth T of about 40 µm (adequate for 600 V).

Figure 3:
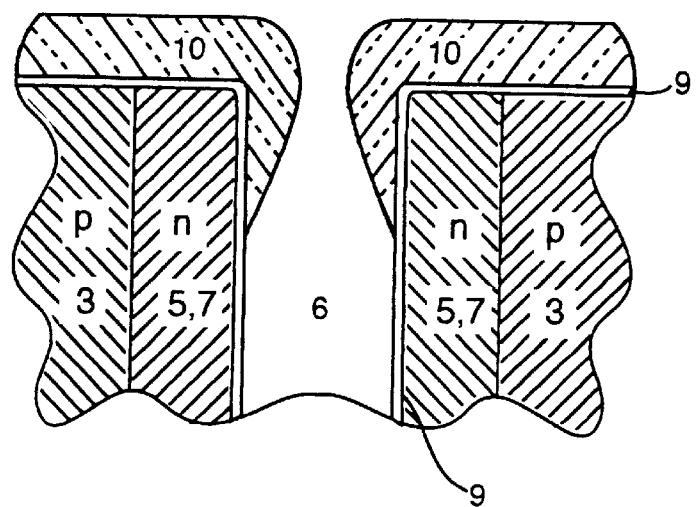
FIGS. 3–5 are cross-sections for explaining a method for closing the trenches.
Figure 4:
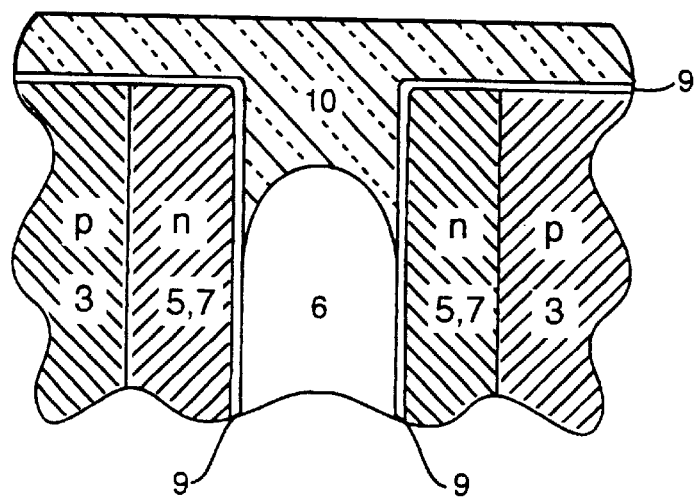
Figure 5:
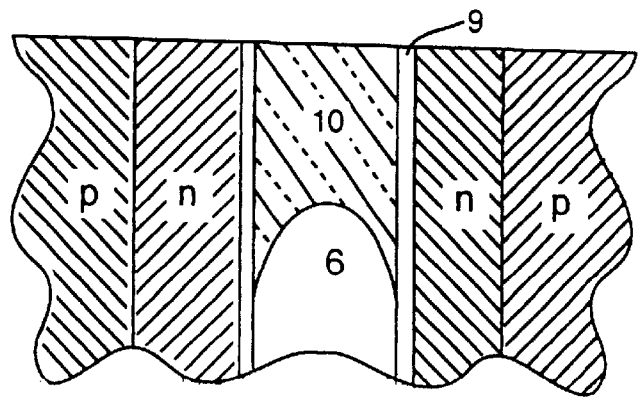

Using the semiconductor arrangement according to FIG. 1 or FIG. 2, the steps shown in FIGS. 3 through 5 are performed. After deposition of a thin passivation layer 9 of, for example, silicon dioxide having a layer thickness of approximately 50 nm, a doped glass 10 such as, for example borophosphorous silicate glass, is applied onto the opening of the cavity 6 and is subsequently caused to flow in a vacuum, so that the structure shown in FIG. 4 arises. The doped glass 10 is then etched back, which can occur with wet-chemical etching in diluted hydrofluoric acid, in order to thus obtain a planar structure corresponding to FIG. 5.

The cavity 6 with a width b of approximately 1 µm under vacuum remains under the doped glass.

Figure 6:
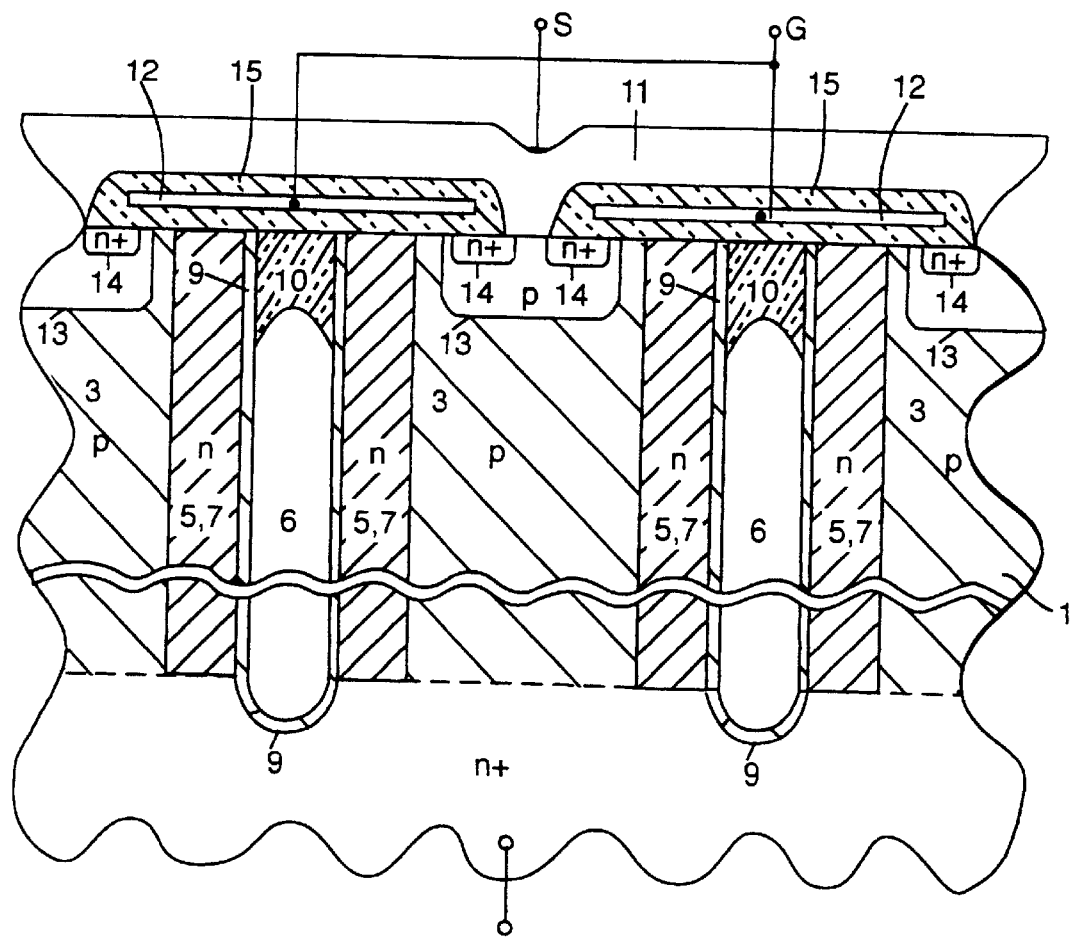
FIG. 6 is a cross-section through a DMOS transistor according to an exemplary embodiment of the invention.

FIG. 6 shows how a standard DMOS transistor having a source electrode S, a drain electrode D, a gate electrode G, a source contact 11 of aluminum, gate contacts 12 of polycrystalline silicon and $n^+$-conductive source zones 14 can be constructed in p-wells 13 between the individual cavities 6 or, respectively, trenches 4. The gate contacts 12 are thereby embedded into an insulating layer 15 of, for example, silicon dioxide.

Figure 7:
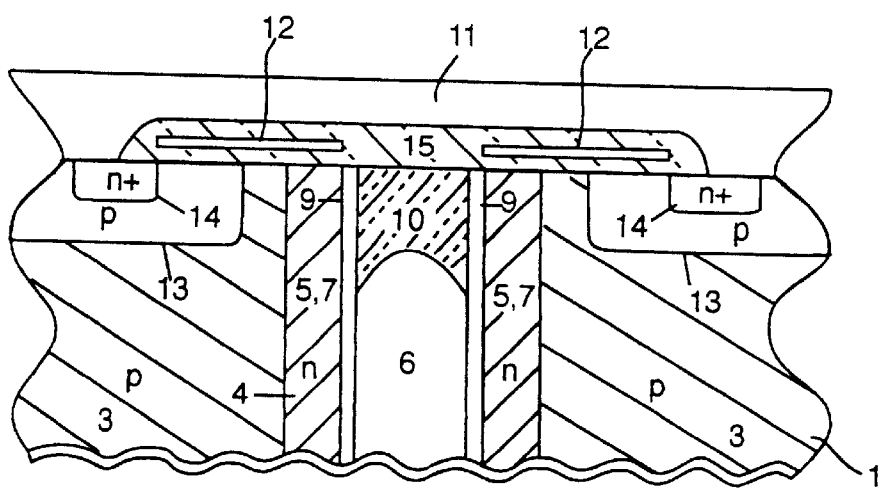
FIG. 7 is a cross-section through a DMOS transistor according to another exemplary embodiment of the invention.

FIG. 7 illustrates an exemplary embodiment in which the structure with the DMOS transistor is produced first, and then the etching of the trench 4 and the production of the cavity follow.

The invention thus enables a semiconductor component that can be manufactured in a simple way, since the zones with alternating conductivity type in alternation can be generated without further effort with the assistance of the trenches 4, and the remaining cavities 6 can be closed without further ado. The area requirement of the inventive semiconductor component is also extremely slight since the zones that effect the clearing of the charge carriers proceed vertically relative to the principal faces, so that a high integration density can be achieved.

The above-described method and communication system are illustrative of the principles of the present invention. Numerous modifications and adaptions thereof will be readily apparent to those skilled in this art without departing from the spirit and scope of the present.

The inventive semiconductor component can advantageously be a transistor, particularly a vertical resurf transistor, or a diode, particularly a Schottky diode, or a capacitor as well.

What is claimed is:

1. A semiconductor component comprising:

a semiconductor body with two principal faces;

at least two electrodes wherein at least one of said electrodes is provided on one of said principal faces; and zones of a conductivity type opposite one another that are arranged in alternation in said semiconductor body and extend perpendicularly to said two principal faces, an application of a voltage to said two electrodes mutually clearing said zones of charge carriers so that an essentially constant field strength is built up in said semiconductor body between said two electrodes said zones containing a cavity that is closed by a glass layer or by a sputtered layer.

2. The semiconductor component according to claim 1, wherein said cavity has a trench structure with a width of approximately 1 $\mu$m and a depth of approximately 40 $\mu$m.

3. The semiconductor component according to claim 2, wherein said cavity is closed at an end lying opposite an end at one of said principal faces.

4. The semiconductor component according to claim 2, wherein said cavity is closed by said glass layer, and said glass layer comprises doped borophosphorous silicate.

5. The semiconductor component according to claim 1 wherein inside walls of said cavity comprise a passivation layer.

6. The semiconductor component according to claim 5, wherein said passivation layer is a silicon dioxide layer having a layer thickness of approximately 50 nm.

* * * * *